(12) United States Patent
Koura (10) Patent No.: US 7,737,718 B2
(45) Date of Patent: Jun. 15, 2010

(54) POWER SUPPLY ASSEMBLY AND SEMICONDUCTOR TESTING SYSTEM USING SAME

(75) Inventor: Isamu Koura, Musashino (JP)

(73) Assignee: Yokogawa Electric Corporation, Musashino-shi (JP)

( * ) Notice: Subject to any disclaimer, the term of this patent is extended or adjusted under 35 U.S.C. 154(b) by 0 days.

(21) Appl. No.: 11/751,311

(22) Filed: May 21, 2007

(65) Prior Publication Data

US 2007/0296454 A1 Dec. 27, 2007

(30) Foreign Application Priority Data

May 24, 2006 (JP) ............................. 2006-143496

(51) Int. Cl.
*G01R 31/36* (2006.01)
(52) U.S. Cl. ..................... 324/771; 324/416; 323/282
(58) Field of Classification Search ................ 324/416, 324/754–765, 158.1, 771; 323/282
See application file for complete search history.

(56) References Cited

U.S. PATENT DOCUMENTS

| | | | | |
|---|---|---|---|---|
| 3,816,812 A | * | 6/1974 | Alber et al. ................. 324/712 |
| 5,959,463 A | * | 9/1999 | Funakura et al. ............. 324/765 |
| 6,204,647 B1 | * | 3/2001 | Niemann et al. ............. 323/282 |
| 6,369,558 B2 | * | 4/2002 | Umemoto ................... 323/282 |
| 6,586,958 B2 | * | 7/2003 | Sudo et al. .................. 324/765 |
| 6,624,702 B1 | * | 9/2003 | Dening ....................... 330/297 |
| 7,132,844 B2 | * | 11/2006 | Hashimoto .................. 324/765 |
| 7,247,956 B2 | * | 7/2007 | Berger et al. ................. 307/151 |
| 7,277,303 B2 | * | 10/2007 | Tanaka et al. ................ 363/65 |
| 7,397,235 B2 | * | 7/2008 | Harjung ..................... 324/158.1 |
| 2007/0057655 A1 | * | 3/2007 | Nishida ...................... 323/282 |

FOREIGN PATENT DOCUMENTS

JP 2005-98896 A 4/2005

OTHER PUBLICATIONS

Office Action dated Jan. 28, 2010 in Corresponding Taiwanese Patent Application No. 096116101.

* cited by examiner

*Primary Examiner*—Ha Tran T Nguyen
*Assistant Examiner*—Arleen M Vazquez
(74) *Attorney, Agent, or Firm*—Westerman, Hattori, Daniels & Adrian, LLP (57) ABSTRACT

A power supply assembly that can be miniaturized even though an applied voltage to a load is rendered variable, and a semiconductor testing system using the same are put into practice. With an improvement of the power supply assembly for finding an error against a set voltage by feeding back an applied voltage applied to a load, and applying a predetermined voltage to the load by causing an output amplifier to increase and decrease amperage to be fed to the load on the basis of the error, it is characterized in provided a voltage converter causing a voltage level of a power supply voltage of the output amplifier to follow up a voltage level of the set voltage.

7 Claims, 7 Drawing Sheets

consumed power of an output amplifier, as a loss
(plus side power)
= (power supply voltage VDD − output voltage level Vout) × output current Iout
⇒ 70 [W] @ (Vout=1[V])
⇒ 75 [W] max @ (Vout=0[V])

FIG. 9 (PRIOR ART)

rated output power of power supply unit
(plus side) : 150 W

POWER SUPPLY ASSEMBLY AND SEMICONDUCTOR TESTING SYSTEM USING SAME

FIELD OF THE INVENTION

The present invention relates to a power supply assembly to be used in, for example, a semiconductor testing system, for finding an error against a set voltage by feeding back an applied voltage applied to a load (for example, a device as a test subject), and applying a predetermined voltage to the load by causing an output amplifier to increase and decrease amperage to be fed to the load on the basis of the error, and a semiconductor testing system using the same, and more particularly, to a power supply assembly that can be miniaturized even though a voltage applied to a load is rendered variable, and a semiconductor testing system using the same.

BACKGROUND OF THE INVENTION

With a semiconductor testing system (including so-called an IC tester, LSI tester, and so forth; hereinafter referred to merely as a tester), it is necessary to supply a device as a test subject {hereinafter referred to as a DUT (Device Under Test)} with a voltage with high precision in order to inspect and test the DUT with good precision. Accordingly, a tester is provided with a power supply assembly capable of outputting a voltage with high precision. Determination on whether or not a DUT is acceptable has been made by taking measurements on current flowing from the power supply assembly to the DUT. The DUT includes, for example, an IC, LSI, and so forth (refer to, for example, Patent Document 1).

Figure 6:
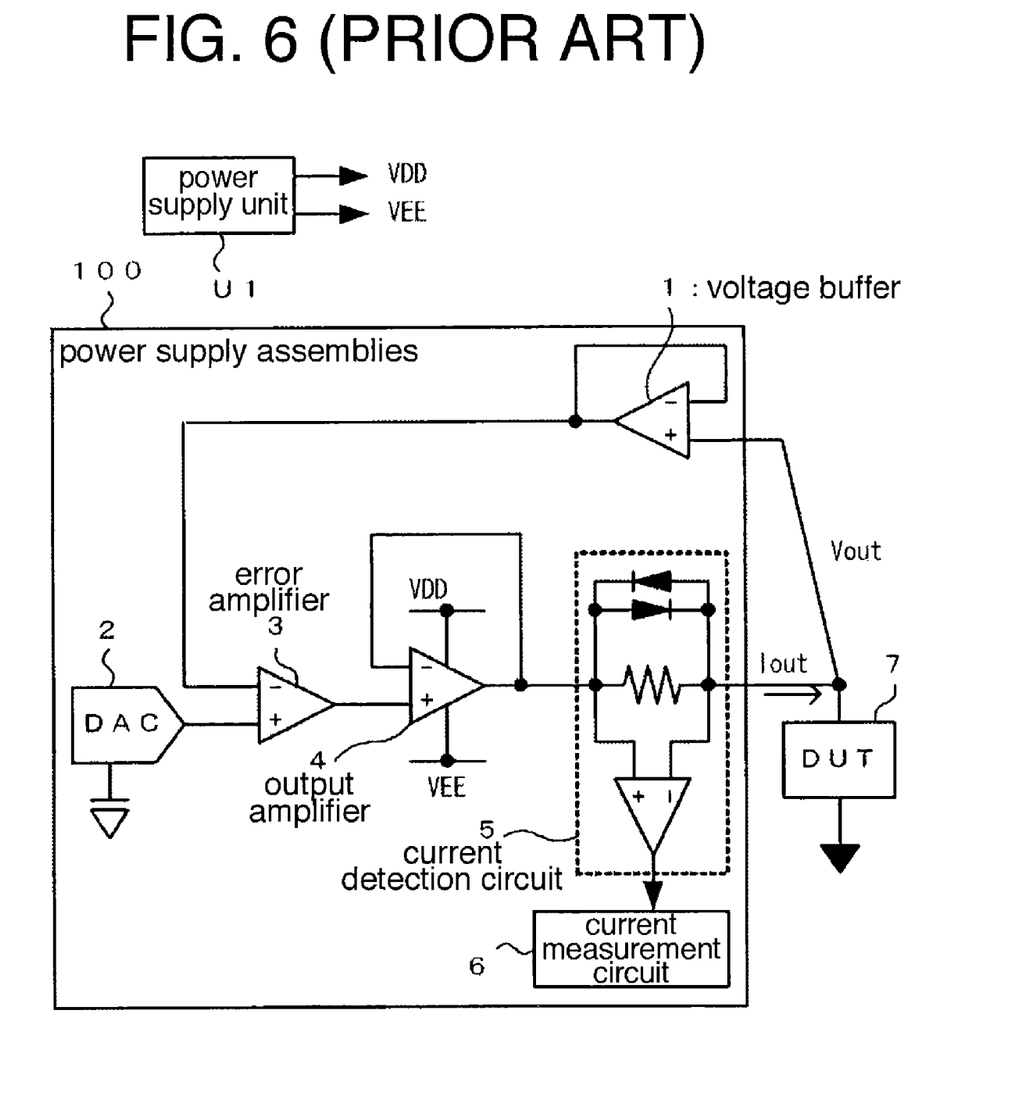
FIG. 6 is a block diagram showing a configuration of a semiconductor testing system using a conventional power supply assembly.

FIG. 6 is a block diagram showing a configuration of a tester using a conventional power supply assembly.

In FIG. 6, a power supply assembly 100 is installed in a tester main body, and comprises a voltage buffer 1, a DAC 2, an error amplifier 3, an output amplifier 4, a current detection circuit 5, and a current measurement circuit 6, wherein the power supply assembly 100 outputs voltage and current to a DUT 7 while monitoring a level of a voltage applied to the DUT 7.

The DUT 7 is a load, and has a plurality of terminals for input/output, and a predetermined voltage Vout is applied from the power supply assembly 100 to a desired terminal (a DUT terminal). Further, the DUT 7 is placed on the top of a performance board (not shown) of a test head (not shown) of the tester.

The voltage buffer 1 has a noninverting input terminal, to which an applied voltage Vout to the DUT 7 is inputted. The DAC 2 is a kind of a voltage generation circuit, and outputs a predetermined set voltage Vout. An output voltage from the voltage buffer 1, and an output voltage from the DAC 2 are inputted to the error amplifier 3.

An error signal from the error amplifier 3 is inputted to the output amplifier 4, which either increase or decrease amperage to the DUT terminal of the DUT 7, thereby applying a voltage Vout as corrected by an error portion to the DUT 7. Further, with the output amplifier 4, an output terminal is connected to an inverting input terminal. Still further, the output amplifier 4 is driven by a power supply voltage (voltage level: VDD on the plus side, and VEE on the minus side) from a power supply unit U 1. In this case, the power supply unit U 1 constantly outputs a voltage at a given level regardless of an output voltage, and an output current of the output amplifier 4.

The current detection circuit 5 is provided between the output amplifier 4, and the DUT 7. The current measurement circuit 6 takes measurements on current by the agency of a signal from the current detection circuit 5. Further, the power supply voltage from the power supply unit U 1 is also fed to the voltage buffer 1, the DAC 2, the error amplifier 3, the current detection circuit 5, and so forth, although not shown in the figure.

Operation of the tester is described hereinafter.

The DAC 2 outputs the predetermined set voltage Vout. A voltage signal from the DAC 2 is inputted to a noninverting input terminal of the error amplifier 3, and a voltage being applied to the DUT 7 is inputted to an inverting input terminal of the error amplifier 3 via the voltage buffer 1, as being fed back.

Further, the error amplifier 3 amplifies an error within a amplifier 4. Then, the output amplifier 4 increases or decreases the amperage fed to the DUT 7 on the basis of the error signal from the error amplifier 3 so as to reduce a voltage error at the error amplifier 3. That is, the set voltage of the DAC 2 is used as a reference.

The applied voltage to the DUT 7, after varied by an increase or a decrease in amperage, is fed back again to the error amplifier 3 via the voltage buffer 1, and the error amplifier 3 detects an error. Further, the output amplifier 4 causes an increase or a decrease in amperage so as to reduce the error. Thus, a level of the voltage applied to the DUT 7 is finally rendered equivalent to that of the set voltage Vout of the DAC 2 to be subsequently maintained.

Meanwhile, the current detection circuit 5 converts current applied to the DUT 7 into voltage, and an ADC (not shown) of the current measurement circuit 6 executes A/D conversion of the voltage to be then outputted to a determination circuit (not shown) in a later stage, whereupon the determination circuit determines whether or not the DUT 7 is acceptable.

Figure 7:
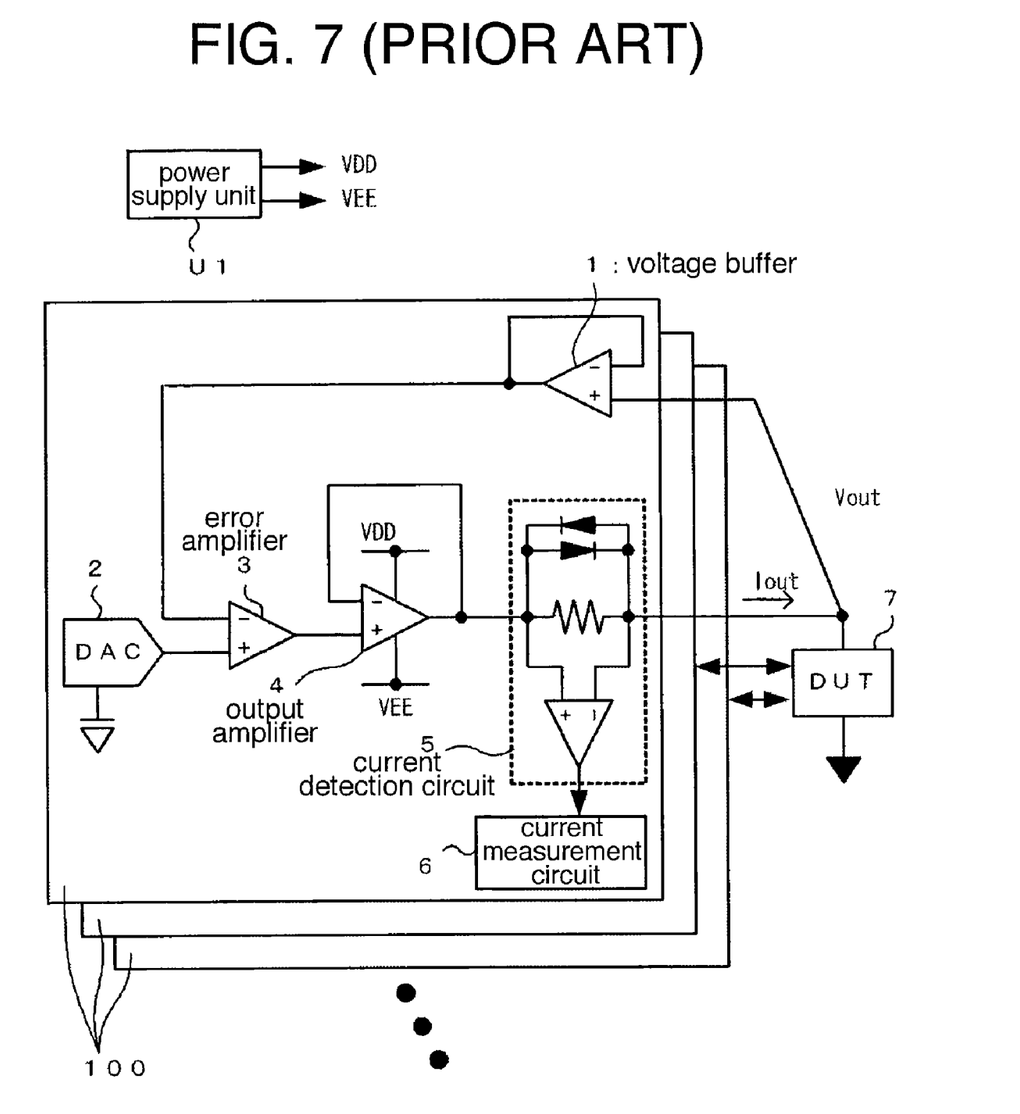
FIG. 7 is a block diagram showing a configuration of a semiconductor testing system using a plurality of the conventional power supply assemblies.

FIG. 7 is a block diagram showing a configuration of a tester with a plurality of channels of the power supply assemblies 100 mounted therein. The power supply assemblies 100 each apply a voltage to different terminals of a DUT 7, however, the power supply voltage (VDD, VEE) from the same power supply unit U 1 is supplied to respective output amplifiers 4.

Further, a primary cause for occurrence of the error between the set voltage of the DAC 2, and the applied voltage to the DUT 7 is occurrence of a potential difference between a preference potential of the DAC 2, and a reference potential of the DUT 7. The DUT 7 is normally connected to the ground at a reference potential of a whole tester (the reference potential of the DAC 2 as well is equivalent to the ground potential as the reference potential of the whole tester). Upon flow of current at a large amperage to the DUT 7, however, a voltage drop occurs to a signal line form the DUT 7 to the ground. Accordingly, the reference potential of a system ground differs from the reference potential of the DUT 7 (voltages at respective terminals of the DUT 7, at the reference potential thereof), thereby causing a difference between the reference potential of the DAC 2, and the reference potential of the DUT 7. Other causes for the error include, for example, a voltage drop accompanying resistance in flow paths up to the current detection circuit 5, and up to the DUT 7, respectively.

[Patent Document 1] JP 2005-98896 A

With the structure of the power supply assembly and semiconductor testing system using same, the output voltage of the power supply assembly 100 has a variable voltage level, that is, the set voltage that can be outputted by the DAC 2 is rendered variable so as to be able to cope with the kind of a device, and various test items. To give an example of a specification, the output voltage is set in a range of 0 to 10 V. The power supply voltage level of the output amplifier 4 need to have a potential difference equivalent to the output voltage outputted by the output amplifier 4 with a bias voltage added thereto. For example, there is the need for the potential difference ΔV=approx. 5 V. Accordingly, because the level of the power supply voltage (VDD, VEE) supplied to the output amplifier 4 is fixed, the level of the power supply voltage VDD on the plus side need be at least 15 V in order to meet the specification in respect of the output voltage of the power supply assembly 100.

Further, in the case where a plus current Iout is consumed at the DUT 7, the current Iout is fed to the DUT 7 via a plus side power supply voltage terminal (the voltage level VDD side) of the output amplifier 4. In the case where a minus current Iout is consumed at the DUT 7, the current Iout is absorbed from the DUT 7 via a minus side power supply voltage terminal (the voltage level VEE side) of the output amplifier 4.

And, the power supply voltage levels VDD, VEE (that is, the respective levels of the voltages outputted by the power supply unit U 1) of the output amplifier 4 are under control by a constant voltage operation without depending on the set voltage of the DAC 2, and the current Iout consumed at the DUT 7.

Figure 8:
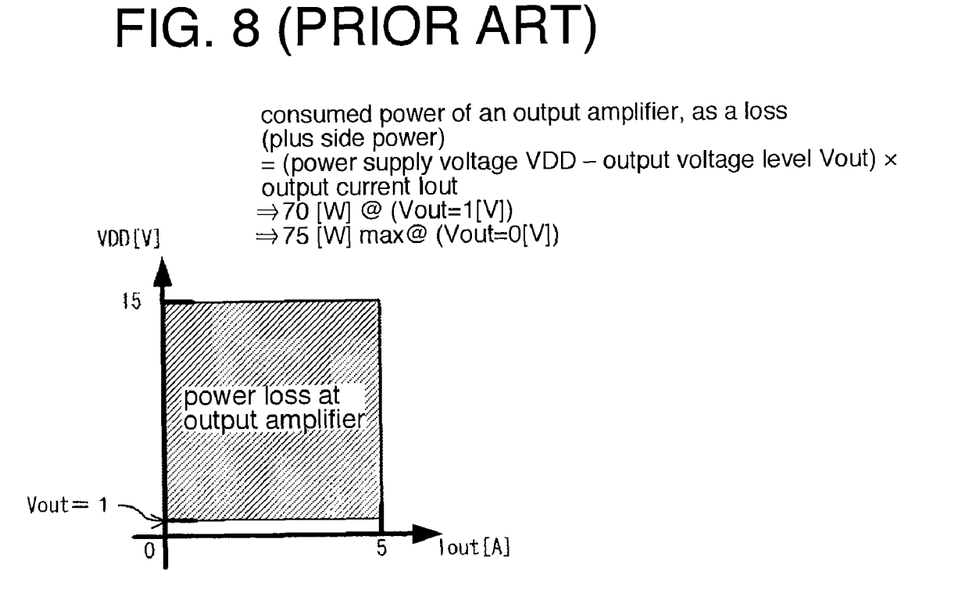
FIG. 8 is a conceptual view showing consumed power of an output amplifier 4 of a power supply assembly 100 shown in FIG. 6, as a loss of a plus side power.

Now, FIG. 8 is a conceptual view showing consumed power of the output amplifier 4, as a loss of a plus side output. Assuming by way of example that VDD=15 V, Vout=1 V, and Iout=5 A, power loss at the output amplifier 4 will be 70 W={(the power supply voltage level−the output voltage level)×the output current}. Further, if Vout=0 V, a loss of consumed power will be 75 W at the maximum. Then, the consumed power is released in the form of heat from the output amplifier 4.

Figure 9:
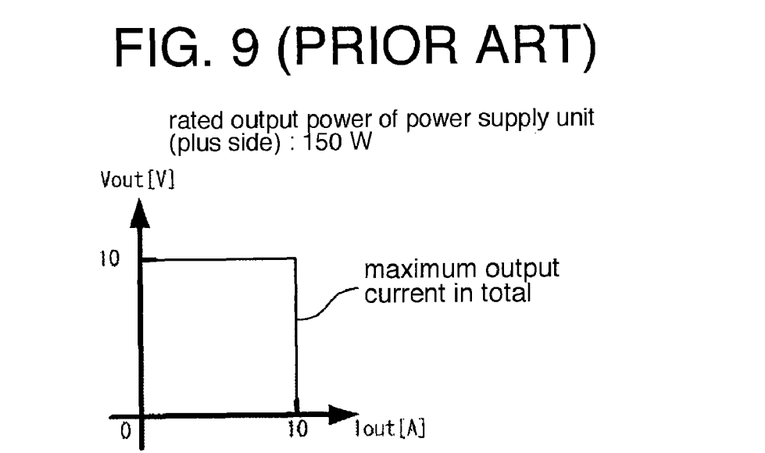
FIG. 9 is a conceptual view showing the total current and output power which the power supply assemblies 100 in whole can output when a plurality of the channels of the power supply assemblies 100 are mounted.

FIG. 9 is a conceptual view showing the total current and output power which the power supply assemblies 100 in whole can output when the plurality of the channels of the power supply assemblies 100 are mounted as shown in FIG. 7. Assuming by way of example that Vout=10 V (the maximum output level), ΔV=5 V, and rated output power of the power supply unit U 1=150 W, the total current will be 10 A at the maximum regardless of the set voltage of the DAC 2, so that the lower the voltage level of the set voltage, the lower will be utilization efficiency of electric power.

In particular, there have lately been seen trends for lower voltage and lager amperage in the case of a device used as the DUT 7 to be measured by a semiconductor testing system. In the case of outputting a large amperage at such a low voltage to the device, a heat release problem with the conventional power supply assembly 100 has posed a very significant problem. Accordingly, a heat release design for the power supply assembly 100 becomes larger in scale, thereby creating causes for an increase in size as well as cost of the power supply assembly 100.

In addition, because the semiconductor testing system has a multitude of the power supply assemblies 100, magnitude of heat release becomes significant, and reduction in size of the power supply assembly is difficult to implement, so that there has arisen a problem of difficulty in checking the cost thereof.

SUMMARY OF THE INVENTION

It is therefore an object of the invention to provide a power supply assembly that can be miniaturized even though an applied voltage to a load is rendered variable, and to provide a semiconductor testing system using the same.

In accordance with a first aspect of the invention, there is provided a power supply assembly for finding an error against a set voltage by feeding back an applied voltage applied to a load, and applying a predetermined voltage to the load by causing an output amplifier to increase and decrease amperage to be fed to the load on the basis of the error, wherein a voltage converter causing a voltage level of a power supply voltage of the output amplifier to follow up a voltage level of the set voltage is provided.

The voltage converter preferably comprises a level-shift circuit for adding a bias voltage to the voltage level of the set voltage, and a DC-DC converter for outputting a power supply voltage to the output amplifier on the basis of a voltage level from the level-shift circuit.

The DC-DC converter may be a step-down converter.

The invention in its second aspect provides a semiconductor testing system used for inspection of devices, comprising a power supply unit, and any one of the power supply assemblies described in the foregoing, driven by power supplied from the power supply unit, wherein the load is a device under test.

With some of the power supply assemblies described in the foregoing, the DC-DC converter is a switching power supply, and preferably executes switching control in sync with a clock signal for system control.

The semiconductor testing system preferably comprises a current measurement circuit for taking measurements on current fed from some of the power supply assemblies described in the foregoing to the device under test, and a timing adjuster for causing the switching power supply to stop switching while the current measurement circuit takes measurements on the current.

A plurality of any of the power supply assemblies described in the foregoing may be provided, and electric power may be fed thereto from the same power supply unit.

Further, a plurality of any of the power supply assemblies described in the foregoing may be provided, electric power may be fed thereto from the same power supply unit, and switching control may be executed through synchronization among the power supply assemblies.

The invention has the following advantageous effects.

Since the voltage converter causes the voltage level of the power supply voltage of the output amplifier to follow up the voltage level of the set voltage, consumed power (a loss) at the output amplifier 4 can be rendered constant regardless of an output voltage level of the output amplifier 4. By so doing, it is possible to suppress heat release, and considerably reduce content of dependency on heat-release designing (for example, heat-release designing is caused to be easy and not to take time, and the power supply assembly is caused to be manufactured with ease), thereby implementing miniaturization in circuit configuration, and reduction in cost as well.

Further, since any of the power supply assemblies described in the foregoing is used in the semiconductor testing system, it is possible to suppress heat release from the power supply assembly, and to considerably reduce content of dependency on heat-release designing, thereby implementing miniaturization of the system as a whole, and reduction in cost as well.

Still further, since the consumed power (the loss) of the output amplifier 4 is constant, rated output power of the power supply unit can be checked even in the case where the plurality of the power supply assemblies are provided, and the output voltage of the output amplifier 4 is low.

DETAILED DESCRIPTION OF PREFERRED EMBODIMENTS

Preferred embodiments of the invention are described hereinafter with reference to the accompanying drawings

First Embodiment

Figure 1:
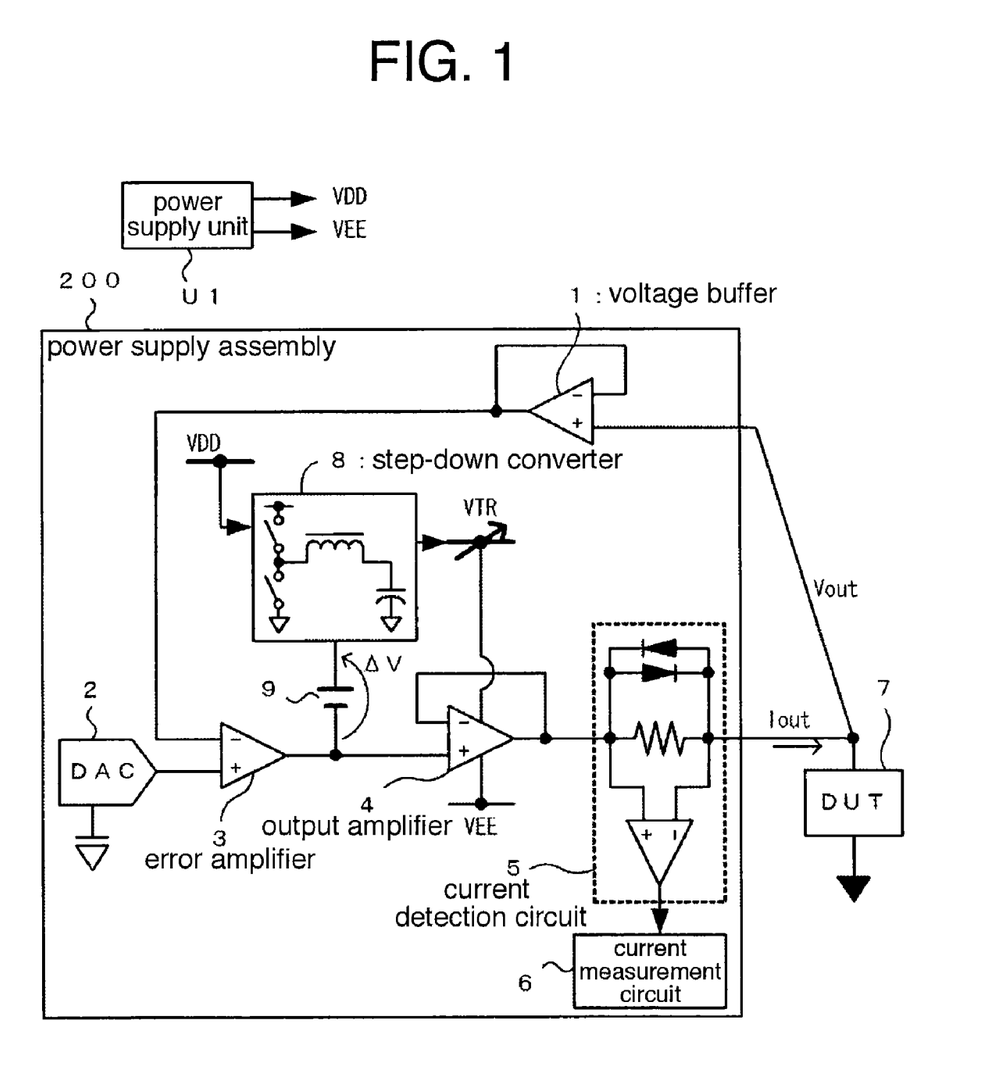
FIG. 1 is a bock diagram showing a first embodiment of a power supply assembly according to the invention.

FIG. 1 is a bock diagram showing a first embodiment of a power supply assembly (when used in a tester) according to the invention. In the figure, parts corresponding to those in FIG. 6 are denoted by like reference numerals, omitting therefore description thereof. In FIG. 1, a power supply assembly 200 is installed in a tester main body, and is equivalent to a power supply assembly 100 shown in FIG. 6, additionally provided with a step-down converter (step-down type converter) 8 as a kind of a switching power supply, and a bias power supply 9.

The step-down converter 8 is a DC-DC converter for stepping down a power supply voltage level VDD from a power supply unit U 1 to thereby convert the same to a voltage level VTR identical to a reference voltage from the bias power supply 9 to be subsequently outputted to a plus side power supply voltage terminal of an output amplifier 4. In this connection, the step-down converter 8 outputs an output voltage which is lower than an input voltage. The term "lower" in the case means that an absolute value of an amplitude of the input voltage of the converter 8>absolute value of an amplitude of the output voltage of the converter 8. For example, if the input voltage to the plus side of the converter 8 is +15 V, the output voltage to the output amplifier 4 is in a range of +5 to +10V while if the input voltage to the minus side of the converter 8 is −15 V, the output voltage a range of −10 to −5 V is outputted. Further, the step-down converter 8 is generally capable of executing power conversion at high efficiency on the order of 95%, and charge current flows to an output side capacitor for smooth rectification for the entire period (both the "on" and the "off" periods of a switching transistor incorporated therein). Accordingly, DC output has small ripples, exhibiting excellent characteristics.

The bias power supply 9 is a level-shift circuit, and adds a bias voltage (a potential difference: ΔV) to a voltage level on a path between an output terminal of an error amplifier 3, and a noninverting input terminal of the output amplifier 4, thereby outputting the reference voltage to the step-down converter 8. In this case, the step-down converter 8, and the bias power supply 9 make up a voltage converter.

Now, operation of the tester is described hereinafter.

The level-shift circuit 9 adds the bias voltage to a voltage level of an error signal from the error amplifier 3, thereby generating the reference voltage to be outputted to the step-down converter 8. Then, the step-down converter 8 converts the power supply voltage level VDD from the power supply unit U 1 into the voltage level VTR identical to the reference voltage, thereby outputting the same as a power supply voltage VTR to the output amplifier 4. In such a case, the step-down converter 8 preferably executes switching in sync with a clock signal to serve as a base for the power supply assembly 200. More specifically, with the tester, the clock signal for synchronizing all parts of the tester is fed from a clock unit (not shown) to a DAC 2 and a current measurement circuit 6 of the power supply assembly 200. And, the step-down converter 8 preferably generates a triangular wave in sync with a frequency of the clock signal on the basis of the clock signal from a clock unit (not shown), thereby switching at a frequency identical to that of the clock signal.

The output amplifier 4 is a voltage buffer that acts as a current drive circuit, and effects one-fold (1×) amplification in terms of voltage. That is, the voltage level of the reference voltage fed to the step-down converter 8 will be equivalent to the voltage level of an output voltage of the power supply assembly 200 (that is, a voltage applied to a DUT 7) plus the bias voltage (Vout+ΔV). Further, the output voltage of the power supply assembly 200 is based on a set voltage of a DAC 2. Accordingly, the voltage level VTR of the power supply voltage fed from the step-down converter 8 to the output amplifier 4 follows up a voltage level of the set voltage of the DAC 2.

Then, the power supply voltage of the output amplifier 4 will be at the voltage level VTR on the plus side (variable depending on the set voltage), and at the voltage level VEE on the minus side. Further, in the case where the output amplifier 4 causes a plus current Iout to be consumed at the DUT 7 on the basis of an error signal from the error amplifier 3, the current Iout is fed to the DUT 7 via a plus side power supply voltage terminal (the voltage level VTR side) of the output amplifier 4. In the case where a minus current Iout is consumed at the DUT 7, the current Iout is absorbed from the DUT 7 via a minus side power supply voltage terminal (the voltage level VEE side) of the output amplifier 4.

Respective operations of a voltage buffer 1, the DAC 2, a current detection circuit 5, and the current measurement circuit 6, other than those parts described as above, are the same as respective operations of those of the assembly shown in FIG. 6, omitting therefore description thereof.

Figure 2:
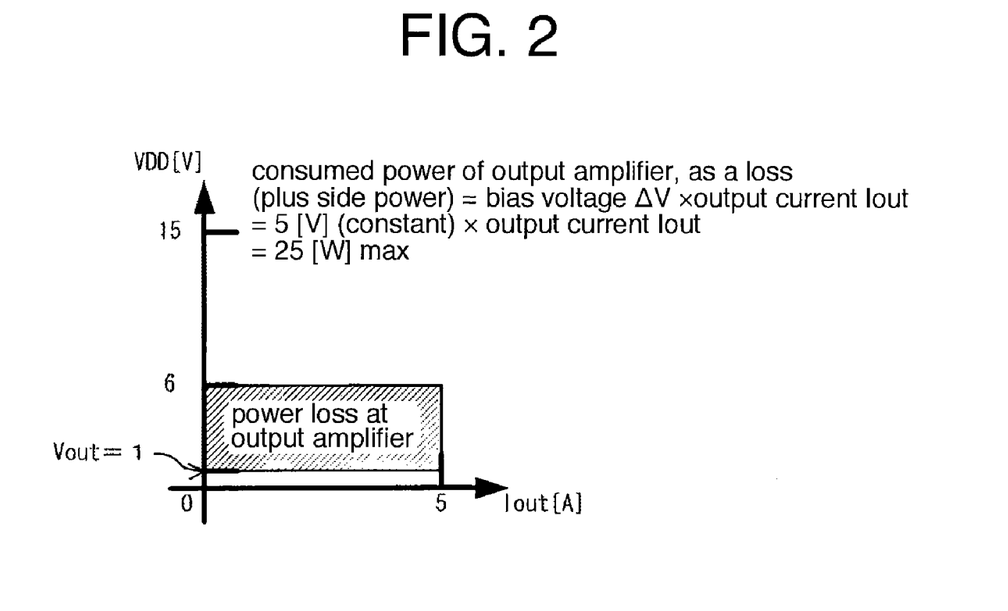
FIG. 2 is a conceptual view showing consumed power of the output amplifier 4 of the power supply assembly 200 shown in FIG. 1, as a loss of a plus side power.

FIG. 2 is a conceptual view showing consumed power of the output amplifier 4, as a loss of a plus side power. Assuming that VDD=15 V, Vout=1 V, Iout=5 A, and ΔV=5 V according to the example shown in FIG. 8, there is obtained VTR=6 V. Then, a power loss at the output amplifier 4 will be constant as follows.

$$\text{consumed power} = \left(\begin{array}{c}\text{the power supply voltage level } VTR - \\ \text{the output voltage } Vout\end{array}\right) \times \text{output current } Iout =$$

$$\Delta V \times \text{output current } Iout = 5V \times 5A = 25W$$

Figure 3:
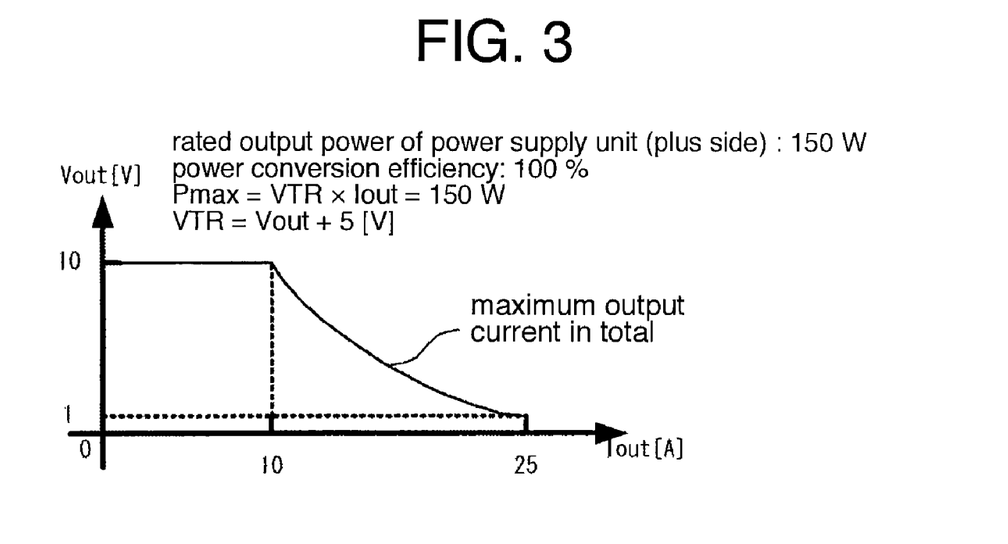
FIG. 3 is a conceptual view showing the total current and output power which the power supply assemblies 200 in whole can output when a plurality the power supply assemblies 200 are mounted.

Further, FIG. 3 is a conceptual view showing the total current and output power which the power supply assemblies 200 in whole can output when a plurality of channels of the power supply assemblies 200, each as shown in FIG. 1, are mounted as shown in FIG. 7. Assuming that Vout=10 V (the maximum output level), bias voltage ΔV=5 V, and the rated output power of the power supply unit U 1=150 W, according to the example shown in FIG. 9, the output current Iout will undergo variations according to the set voltage of the DAC 2. For example, the maximum output current in total will be 10 A at the output voltage Vout=10 V, and the maximum output current in total will increase to 25 A at the output voltage Vout=1 V.

In FIG. 3, calculation is made on the assumption that the step-down converter 8 has conversion efficiency at 100%. The conversion efficiency is actually on the order of 95%, however, the lower the voltage level Vout of the set voltage, the greater will be improvement on the utilization efficiency of electric power.

Thus, the bias voltage ΔV is added to the set voltage having a variable voltage level by the level-shift circuit 9, thereby generating the reference voltage. Then, the step-down converter 8 causes the voltage level VTR of the power supply voltage to be identical in level to the reference voltage to be subsequently outputted to the output amplifier 4, so that consumed power (a loss) at the output amplifier 4 can be rendered constant (ΔV×Iout) regardless of an output voltage level of the output amplifier 4. By so doing, it is possible to suppress heat release, and considerably reduce the content of dependency on heat-release designing, thereby implementing miniaturization in circuit configuration, and reduction in cost as well.

Further, since the step-down converter 8 feed the output amplifier 4 with the voltage level following up the set voltage, the power supply voltage level VDD of the power supply unit U 1 can be rendered higher. By so doing, respective feed currents flowing through interconnection paths from the power supply unit U 1 to the error amplifier 3, the output amplifier 4, the DAC 2, and so forth, respectively, can be rendered lower in amperage. Accordingly, a tester low in cost can be made up.

Furthermore, since the consumed power (the loss) of the output amplifier 4 is constant, the rated output power of the power supply unit U 1 can be checked even in the case where the plurality of the channels of the power supply assemblies 200 are mounted in a tester, and the output voltage of the output amplifier 4 is low. In other words, it is possible to draw output power out of each of the plurality of the channels of the power supply assemblies 200 without increasing the output power of the power supply unit U 1. With a tester, there have lately been seen recent trends that the lower the voltage level of the power supply voltage is, the greater will become amperage of current fed from the power supply assembly to the DUT 7. Hence, the greater the number of the power supply assemblies 200 mounted in the tester, and the lower a level of voltages applied to the DUT 7, the greater will be improvement on utilization efficiency of the power supply unit U 1.

Second Embodiment

Figure 4:
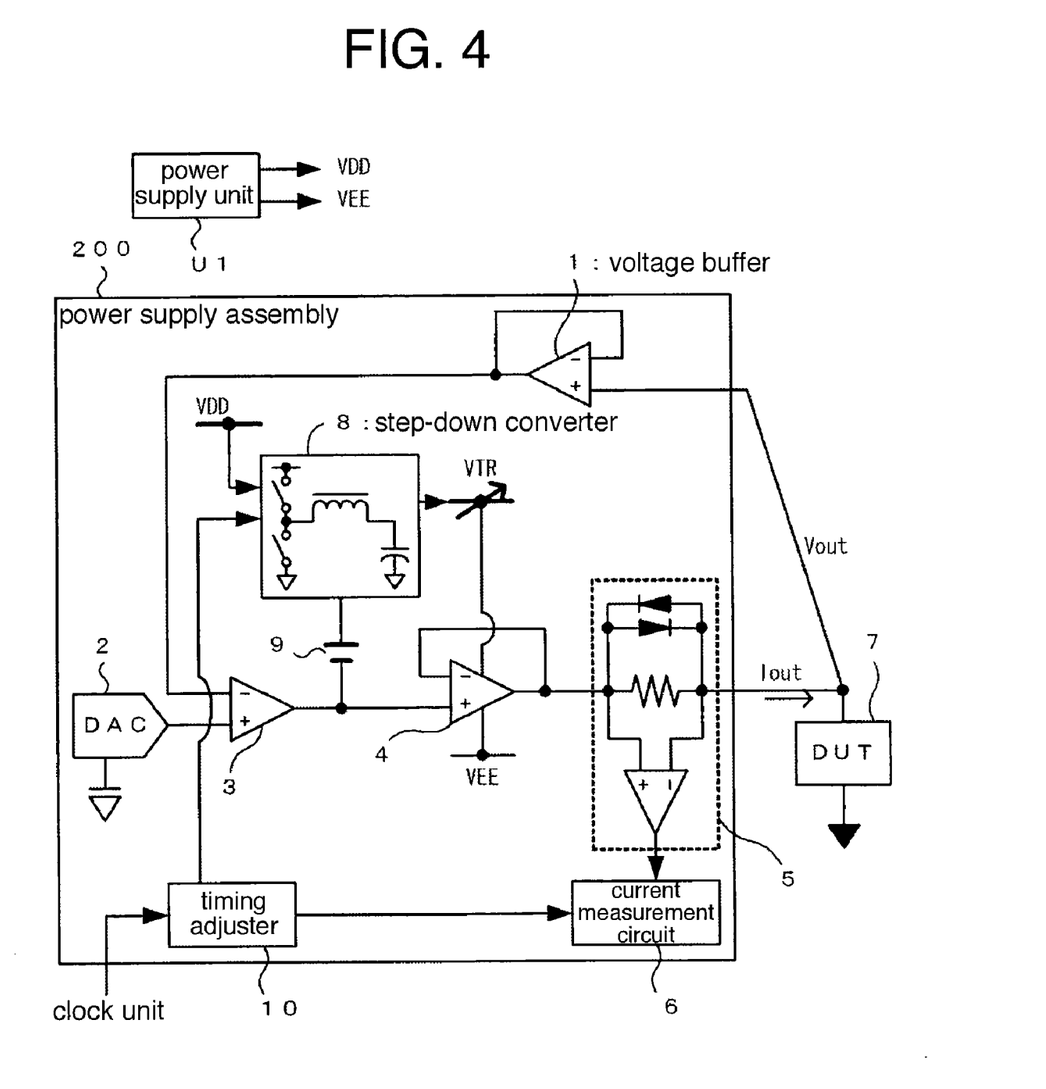
FIG. 4 is a bock diagram showing a second embodiment of a power supply assembly according to the invention.

FIG. 4 is a bock diagram showing a second embodiment of a power supply assembly according to the invention. In the figure, parts corresponding to those in FIG. 1 are denoted by like reference numerals, omitting therefore description thereof. In FIG. 4, there is newly installed a timing adjuster 10. The timing adjuster 10 executes adjustments on conversion timing of an ADC (not shown) of a current measurement circuit 6, and switching timing of a step-down converter 8, on the basis of a clock signal from a clock unit (not shown). More specifically, the timing adjuster 10 causes the step-down converter 8 to stop switching while causing the current measurement circuit 6 to execute A/D conversion to take measurements on current. For example, the timing adjuster 10 generates an INH signal in sync with the clock signal, and the INH signal causes the current measurement circuit 6 to execute the A/D conversion at its low level timing. Then, the timing adjuster 10 obtains AND between the INH signal and the clock signal to be subsequently outputted to the step-down converter 8.

That is, with a tester, there is the need for taking measurements on an output current Iout to a DUT 7 with high precision. In taking measurements on the current as described above, the current to the DUT 7 is converted into voltage by a current detection circuit 5, and the voltage is subjected to A/D conversion by the ADC (not shown) of the current measurement circuit 6 to be then outputted to a determination circuit (not shown) in a later stage. Thereafter, the determination circuit (not shown) determines whether or not the DUT 7 is acceptable. An output of the step-down converter 8 contains voltage noises and current noises due to switching of the step-down converter 8. In general, voltage noises from the power supply assembly 200 are removed by a capacitor provided at a terminal of the DUT 7. Meanwhile, when taking measurements on the current of the power supply assembly 200, accuracy of current measurement will undergo deterioration.

Accordingly, with a circuitry shown in FIG. 4, the timing adjuster 10 stops switching operation of the step-down converter 8 during current measurement by the current measurement circuit 6 (during A/D conversion of data for use in measurement). As a result, it is possible to reduce the current noises due to the switching of the step-down converter 8, thereby measuring the output current with high precision.

Further, it is to be pointed out that the invention is not limited in scope to those described as above, but may include the following.

Figure 5:
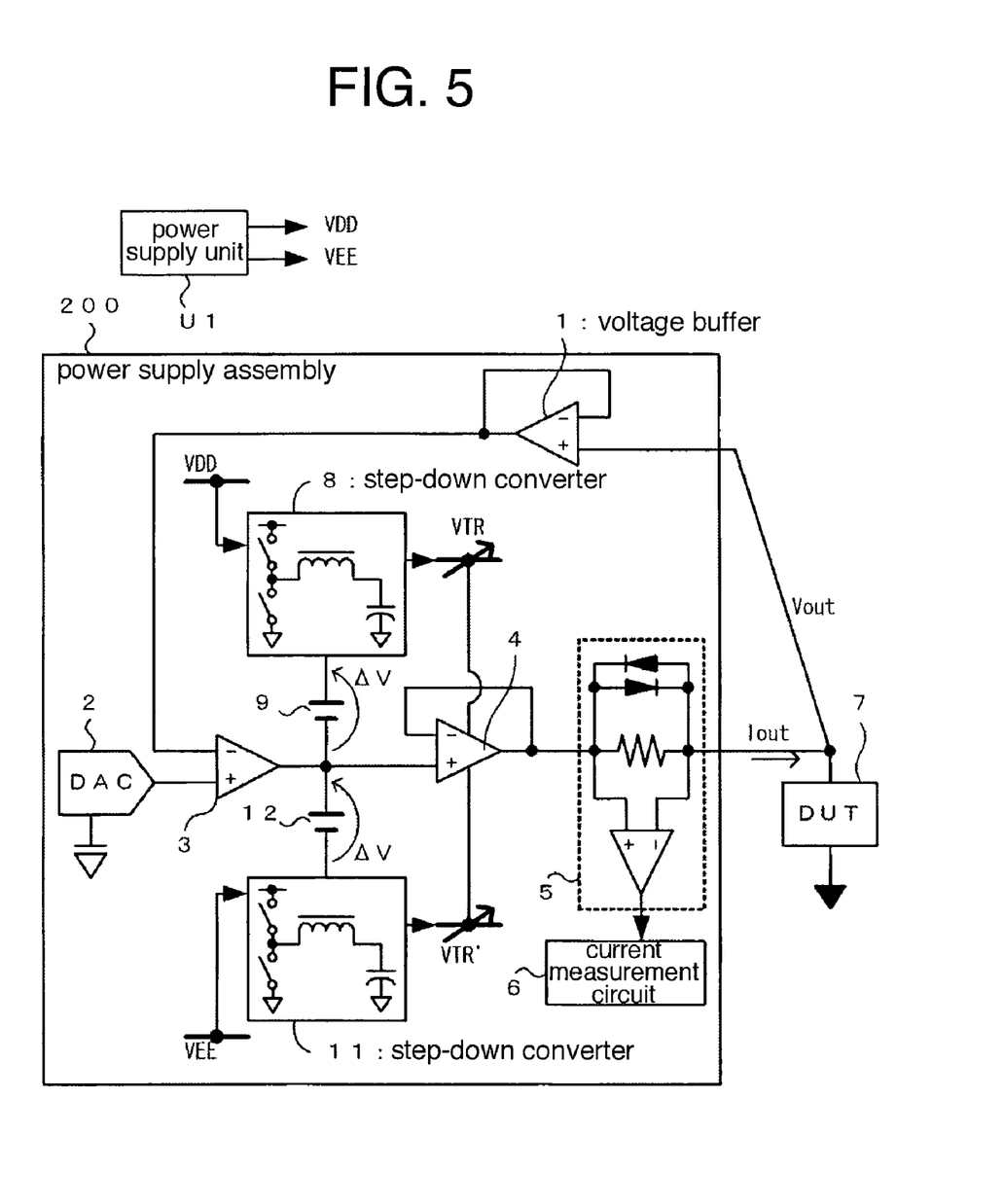
FIG. 5 is a bock diagram showing a third embodiment of a power supply assembly according to the invention.

There is shown a configuration wherein the step-down converter 8 causes the plus side power supply voltage level of the output amplifier 4 to follow up the set voltage, however, the minus side power supply voltage level of the output amplifier 4 may be alternatively caused to follow up the set voltage. That is, a configuration shown in FIG. 5 may be adopted. In the figure, parts corresponding to those in FIG. 1 are denoted by like reference numerals, omitting therefore description thereof. In FIG. 5, a step-down converter 11, and a bias power supply 12 are additionally provided. The bias power supply 12 generates a reference voltage by adding a bias voltage ΔV to the set voltage. Further, the step-down converter 11 lowers a level of the power supply voltage VEE from a power supply unit U 1 to be converted into a voltage level VTR' equivalent in level to the reference voltage from the bias power supply 12 to be subsequently outputted to a minus side power supply voltage terminal of the output amplifier 4. Needless to say, the step-down converter 8 and the bias power supply 9, for the plus side, may not be provided and only the minus side power supply voltage level of the output amplifier 4 may be caused to follow up the set voltage.

Still further, there is shown the configuration wherein the plurality of the channels of the power supply assemblies 200 are mounted, and electric power is fed thereto from the same power supply unit U 1, however, there may be provided a switching controller (not shown), so that the switching controller executes switching control for synchronization of the step-down converters among the power supply assemblies 200.

Yet further, there is shown the configuration where the bias voltage ΔV of the bias power supply 9 is 5 V, however, the potential difference ΔV may be of any other value. Similarly, a range of the output voltage of the power supply assembly 200, the rated output power of the power supply unit U 1, and so forth may be of any value.

Further, there is shown the configuration wherein the power supply assembly 200 is provided with the current detection circuit 5 and the current measurement circuit 6, however, for example, in the case where measurements on current are unnecessary, the current detection circuit 5 and the current measurement circuit 6 need not be provided.

Still further, there is shown the configuration wherein the bias power supplies 9, 11 are provided by way of example of the level-shift circuit, however, use may be alternatively made of any unit capable of adding a predetermined bias voltage to the set voltage.

Further, there is shown the configuration wherein the power supply assembly 200 is used in a tester, however, the power supply assembly according to the invention is not limited in application to the tester and the load is not limited to the DUT. In other words, the invention may be applied to other cases including the case where high efficiency is intended, the case where a DC amplifier is tested, and so forth.

What is claimed is:

1. A power supply assembly for finding an error against a set voltage by feeding back an applied voltage applied to a load, and applying a predetermined voltage to the load by causing an output amplifier to increase and decrease amperage to be fed to the load on the basis of the error, wherein the output amplifier comprises an input terminal receiving the set voltage and a power supply terminal, wherein the power supply assembly is provided with a voltage converter causing a voltage level of a power supply voltage supplied to the power supply terminal of the output amplifier to follow up a voltage level of the set voltage, wherein the voltage level of the power supply voltage of the output amplifier is variable, wherein the voltage converter comprises: a level-shift circuit for receiving the set voltage and adding a bias voltage to the voltage level of the set voltage to generate a reference voltage; and a DC-DC converter connected to the level-shift circuit and receiving the generated reference voltage, and wherein the DC-DC converter is connected to the power supply terminal of the output amplifier and outputs the power supply voltage to the output amplifier on the basis of the reference voltage from the level-shift circuit.

2. The power supply assembly according to claim 1, wherein the DC-DC converter is a step-down converter.

3. A semiconductor testing system used for inspection of devices comprising: a power supply unit; and any one of the power supply assemblies according to claim 1 or 2, driven by power supplied from the power supply unit; wherein the load is a device under test.

4. The semiconductor testing system according to claim 3, wherein a plurality of any of the power supply assemblies are provided, and electric power is fed thereto from the same power supply unit.

5. A semiconductor testing system used for inspection of devices comprising: a power supply unit; and any one of the power supply assemblies according to claim 1 or 2, driven by power supplied from the power supply unit; wherein the load is a device under test; and the DC-DC converter is a switching power supply for executing switching control in sync with a clock signal for system control.

6. The semiconductor testing system according to claim 5, further comprising: a current measurement circuit for taking measurements on current fed from some of the power supply assemblies described in the foregoing to the device under test; and a timing adjuster for causing the switching power supply to stop switching while the current measurement circuit takes measurements on the current.

7. The semiconductor testing system according to claim 5, wherein a plurality of any of the power supply assemblies are provided, electric power is fed thereto from the same power supply unit, and switching control is executed through synchronization among the power supply assemblies.

* * * * *